United States Patent
Adusumilli et al.

(10) Patent No.: US 11,588,105 B2
(45) Date of Patent: Feb. 21, 2023

(54) PHASE-CHANGE MEMORY DEVICE WITH REDUCED PROGRAMMING VOLTAGE

(71) Applicant: International Business Machines Corporation, Armonk, NY (US)

(72) Inventors: Praneet Adusumilli, Somerset, NJ (US); Takashi Ando, Eastchester, NY (US); Reinaldo Vega, Mahopac, NY (US); Cheng Chi, Jersey City, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/198,775

(22) Filed: Mar. 11, 2021

(65) Prior Publication Data

US 2022/0293853 A1  Sep. 15, 2022

(51) Int. Cl.
G11C 11/00 (2006.01)
H01L 45/00 (2006.01)
G11C 13/00 (2006.01)

(52) U.S. Cl.
CPC ...... *H01L 45/1253* (2013.01); *G11C 13/0004* (2013.01); *H01L 45/1226* (2013.01); *H01L 45/16* (2013.01); *H01L 45/06* (2013.01)

(58) Field of Classification Search
None
See application file for complete search history.

(56) References Cited

U.S. PATENT DOCUMENTS

| | | | |
|---|---|---|---|
| 7,525,832 B2 | 4/2009 | Muraoka et al. | |
| 7,978,509 B2 | 7/2011 | Lung et al. | |
| 8,445,887 B2 | 5/2013 | Yoon et al. | |
| 8,822,967 B2 | 9/2014 | Kordus, II et al. | |
| 2008/0112207 A1 | 5/2008 | Pinnow | |
| 2014/0043911 A1 | 2/2014 | Samachisa et al. | |
| 2015/0194601 A1 | 7/2015 | Sills et al. | |
| 2018/0331284 A1* | 11/2018 | BrightSky | ........... H01L 27/2481 |
| 2020/0006431 A1* | 1/2020 | Mayuzumi | .............. H01L 43/12 |

(Continued)

FOREIGN PATENT DOCUMENTS

| | | |
|---|---|---|
| CN | 110544742 A | 12/2019 |
| CN | 110707209 A | 1/2020 |

(Continued)

OTHER PUBLICATIONS

Chang et al., "AI hardware acceleration with analog memory: Microarchitectures for low energy at high speed," DOI: 10.1147/JRD/2019/2934050, IBM J. RES. & DEV., vol. 63, No. 6, Paper 8, Nov./Dec. 2019, ©2019 IBM.

(Continued)

*Primary Examiner* — Viet Q Nguyen
(74) *Attorney, Agent, or Firm* — Kelli D. Morin; Scott S. Dobson

(57) ABSTRACT

A device includes an electronic component, and the electronic component includes a first pad, a second pad, and a strip connecting the first pad and the second pad. The device further includes a first electrode in contact with the first pad and a second electrode in contact with the second pad. The electronic component is made of a phase change material. At least one of the first electrode and the second electrode is coated with a material that is configured to increase a difference in workfunction between the first electrode and the second electrode.

20 Claims, 9 Drawing Sheets

(56) References Cited

U.S. PATENT DOCUMENTS

2020/0075676 A1 3/2020 Salahuddin et al.
2020/0091422 A1 3/2020 Giannopoulos et al.
2020/0287132 A1 9/2020 Slovin et al.

FOREIGN PATENT DOCUMENTS

WO 2008155724 A1 12/2008
WO 2019066769 A1 4/2019

OTHER PUBLICATIONS

Hayakawa et al., "Highly reliable TaOx ReRAM with centralized filament for 28-nm embedded application," 2015 Symposium on VLSI Technology (VLSI Technology), Kyoto, 2015, pp. T14-T15, doi: 10.1109/VLSIT.2015.7223684.

Krebs et al., "Threshold field of phase change memory materials measured using phase change bridge devices," https://aip.scitation.org/doi/full/10.1063/1.3210792?casa_token=7umVCUbOEp4AAAAA%3AB8skfX6EelnaqYHEwy8tNw5w7i9AY21lrw90-Igpl8O8CokCGsjZOtZh4qow12_qoA0s3Ec5INpLlw, Appl. Phys. Lett. 95, 082101 (2009), 3 pgs.

Cooley et al., "Review of electrical contacts to phase change materials and an unexpected trend between metal work function and contact resistance to germanium telluride," J. Vac. Sci. Technol. A 38, 050805 (2020); doi 10.1116/60000321, 20 pgs.

Giannopoulos et al., "8-bit Precision In-Memory Multiplication with Projected Phase-Change Memory," 978-1-7281-1987-8/18/$31.00 ©2108 IEEE, 4 pgs.

International Search Report and Written Opinion, International Application No. PCT/EP2022/055606, dated Jun. 9, 2022, 15 pgs.

Rahman et al., "Differential Work-Function Enabled Bifunctional Switching in Strontium Titanate Flexible Resistive Memories," ACS Appl. Mater. Interfaces 2020, 12, 7326-7333.

\* cited by examiner

PHASE-CHANGE MEMORY DEVICE WITH REDUCED PROGRAMMING VOLTAGE

BACKGROUND

The present disclosure relates to the electrical, electronic, and computer fields. In particular, the present disclosure relates to phase-change memory (PCM) devices having reduced programming voltage for accelerating deep learning.

PCM is a type of non-volatile random-access memory used in computers and other electronic devices to store data. Unlike conventional read-access memory (e.g., dynamic read-access memory (DRAM)), which stores data as electric charge or current flows (e.g., using capacitors), PCM uses the unique phase-change properties and behavior of chalcogenide glass, which is transformable between a crystalline state and an amorphous state by heating the material, or other material with similar properties and behavior. The crystalline and amorphous states of such a material have dramatically different electrical resistivity values. The amorphous state has a high resistance, which can also be referred to as a low conductivity, and can represent a binary value of 0. In contrast, the crystalline state has a low resistance, which can also be referred to as a high conductivity, and can represent a binary value of 1.

SUMMARY

Embodiments of the present disclosure include a device including an electronic component. The electronic component includes a first pad, a second pad, and a strip connecting the first pad and the second pad. The device further includes a first electrode in contact with the first pad and a second electrode in contact with the second pad. The electronic component is made of a phase change material. At least one of the first electrode and the second electrode is coated with a material that is configured to increase a difference in workfunction between the first electrode and the second electrode.

Additional embodiments of the present disclosure include a method of operating a memory device. The method includes passing a current from a first electrode, through a phase-change material element, and through a second electrode when a voltage of the current is greater than a threshold voltage of the phase-change material. The method further includes passing the current through at least one of (i) a first coating on the first electrode and (ii) a second coating on the second electrode. Each of the first coating and the second coating is configured to increase a difference in workfunction between the first electrode and the second electrode.

Additional embodiments of the present disclosure include a method of forming a memory device. The method includes forming a memory cell made of a phase-change material. The method further includes forming an electrode having a coating. The coating alters the workfunction of the electrode, and the coating is in direct contact with the phase-change material.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Figure 1:
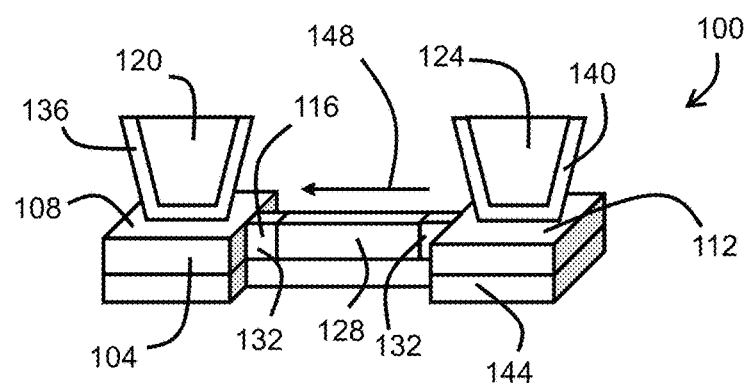
FIG. 1 is a schematic diagram depicting an example configuration of a PCM device, in accordance with embodiments of the present disclosure.

Aspects of the present disclosure relate generally to the electrical, electronic, and computer fields. In particular, the present disclosure relates to phase-change memory (PCM) devices having reduced programming voltage for accelerating deep learning. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, developments are being made in the technologies of non-volatile memory devices to facilitate acceleration of deep learning. In particular, some developments are focused on accelerating matrix multiplication to facilitate acceleration of deep learning. Some developments use an analog array-based computation to improve energy efficiency of artificial intelligence (AI) tasks, like inference and training.

In non-volatile memory devices, the resistive value, which can be binary ('' or '0') or analog (e.g., 0.65), is stored in the memory cell as a function of the cell's electrical resistance. As noted above, phase-change material that is in the amorphous state has a high resistance compared to phase-change material that is in the crystalline state. More specifically, the range of resistance values of a phase-change material is bounded by a "set state" having a "set resistance" and a "reset state" having a "reset resistance." The set state is a low resistance structural state whose electrical properties are primarily controlled by the crystalline portion of the phase-change material, and the reset state is a high resistance structural state whose electrical properties are primarily controlled by the amorphous portion of the phase-change material. In other words, the set state can also be referred to as the crystalline state and/or a low resistance state. In contrast, the reset state can also be referred to as the amorphous state and/or a high resistance state.

Accordingly, in PCM devices, the relative amounts of phase-change material that are in the amorphous state and in the crystalline state within the PCM cell affect the electrical resistance of the PCM cell. This electrical resistance can be measured by passing a current through the PCM cell, and the measured electrical resistance can be converted into a value. Thus, the state of the material can be readily sensed to indicate data.

To change the resistance state of the phase-change material, the ratio of crystalline material to amorphous material is changed. In particular, phase-change materials, like chalcogenide-based materials and similar materials, can be caused to change phase by application of electrical current at levels suitable for implementation in integrated circuits.

Changing the phase-change material from the amorphous state to the crystalline state is generally a lower current operation. In contrast, changing the phase-change material from the crystalline state to the amorphous state is generally a higher current operation, which includes a short high current density pulse to melt or break down the crystalline structure, after which the phase-change material cools quickly, quenching the phase-change process, such that at least a portion of the phase-change structure stabilizes in the amorphous state. It is desirable to minimize the magnitude of the reset current used to cause the transition of the phase-change material from the crystalline state to the amorphous state. One way to reduce the magnitude of the reset current needed for reset is by reducing the size of the phase-change material element in the cell and of the contact area between electrodes and the phase-change material, so that higher current densities are achieved with smaller absolute current values through the phase-change material element.

PCM devices are good candidates for accelerating inference applications because the phase-change properties, namely the ability to transform various amounts of the material, enable the achievement of a number of distinct intermediary resistive states. Accordingly, such devices have the ability to store multiple resistive states, and therefore multiple bits, in a single cell. Cells having this ability may be referred to as multilevel cells. PCM devices are also attractive for accelerating deep learning applications because of the fast switching time and scalability enabled by the phase-change properties discussed above.

One drawback of current PCM device architecture is the relatively high voltage required to alter the state of the phase-change material. These voltage requirements are determined predominantly by the threshold voltage of the PCM devices being programmed. Threshold voltage, in turn, is determined by the amount of the phase-change material in the amorphous state. Requirements for large (high) voltages lead to complex unit cells—in some cases the need for multiple stacked transistors—resulting in lower integration density and higher power consumption.

However, specifically for deep learning applications, the higher the resistance range for programming the PCM cell, the greater the energy efficiency of the application. Achieving a higher resistance range for programming the PCM cell requires that a greater amount of the phase-change material is in the amorphous state. However, as noted above, the greater the amount of phase-change material that must be transformed to the amorphous state, the higher the required switching voltage. The higher the required switching voltage, the more power required to program the cell. It is desirable to minimize the programming voltage threshold to improve the scalability of the technology. Accordingly, it is desirable to develop a PCM device which balances these factors and enables high resistance ranges for programming the PCM cell while lowering the required switching voltage.

Another drawback of PCM technology is that PCM cells experience drift as the resistance of the amorphous state slowly increases over time. This limits the ability for the PCM cell to store multiple bit values, as the resistance-drift interferes with the ability to distinguish a lower intermediate state from a higher intermediate state at a later time. Additionally, resistance-drift could jeopardize standard two-state operation if the threshold voltage increases beyond the design value.

Another drawback of PCM technology is that PCM cells also experience temperature sensitivity due to their reliance on temperature changes to transform the phase-change material to control the resistive state of the cell. In other words, because phase- change is a thermally driven process, rather than an electronic process, care must be taken to prevent thermal conditions that allow for fast crystallization from being too similar to standby conditions, such as room temperature. If the PCM cells are configured to lower the required programming energy by lowering the phase-change temperature such that unintended temperature changes alter the state of crystallization of the material, data retention cannot be sustained.

Embodiments of the present disclosure may overcome these and other drawbacks of current solutions by using a bridge cell architecture in combination with workfunction altering materials. As described in further detail below, such embodiments enable high resistance ranges for programming the PCM cell while lowering the required switching voltage.

Bridge cell devices include two pads connected by a strip, all of which is made of the phase-change material. The resistance of the phase-change material is directly proportional to the length of the phase-change material of the strip that is in the amorphous state. Accordingly, by scaling the thickness and width dimensions of the strip, without affecting the length, it is possible to reduce the amount of material that must be transformed, and therefore reduce the required programming current, without affecting the resistance range. Reducing the required programming current advantageously reduces power, and thus increases the energy efficiency of the PCM device.

Additionally, embodiments of the present disclosure may include incorporating a projection liner into such bridge cell devices. A projection liner reduces resistance-drift, noise, and temperature sensitivity of the bridge cell device by providing a protective layer on the phase-change material. The thinner the strip of the bridge cell, the more susceptible it may be to resistance-drift, noise, and temperature fluctuations. Therefore, some embodiments of the present disclosure may include the projection liner to enable scaling of the thickness and width dimensions of the strip without increasing the susceptibility of the bridge cell to these issues.

Additionally, devices according to embodiments of the present disclosure may be operable in a higher resistance range by only operating in states which contain different lengths of the bridge in the fully amorphous state. In other words, by varying the amount of phase-change material that is in the amorphous state, but always including some amount of phase-change material greater than zero in the amorphous state, it is possible to operate the devices disclosed herein in a higher resistance range. This operation avoids the fully crystalline set state for computation, which is advantageous in deep learning applications.

Bridge cell devices that always include some amount of phase-change material greater than zero in the amorphous state enable the achievement of a memory window of at least ten times greater in very high resistance conditions. However, because the threshold programming voltage for the PCM cell depends on the size of the amorphous area, programming these phase configurations will entail significantly higher programming voltages. Accordingly, it is advantageous to develop a PCM device which retains the benefits of the bridge cell that always includes some amount of phase-change material greater than zero in the amorphous state and also further reduces the threshold programming voltage.

Accordingly, in at least some embodiments of the present disclosure, such a PCM device further includes workfunction altering materials. More specifically, embodiments of the present disclosure include coating at least one of the electrodes of the PCM device with a material that increases the difference in workfunction between the electrodes. As used herein, a material's "workfunction" refers to the minimum quantity of energy required to move an electron to infinity from the surface of a given solid. Accordingly, increasing the difference in workfunction between two materials creates an electrical dipole. Increasing the difference in workfunction across the strip of the bridge cell reduces the field across the bridge, which reduces the threshold voltage. Thus, by increasing the difference in workfunction between the electrodes, which increases the difference in workfunction across the strip of the bridge cell, the threshold programming voltage of the PCM cell is reduced.

It is to be understood that the aforementioned advantages are example advantages and should not be construed as limiting. Embodiments of the present disclosure can contain all, some, or none of the aforementioned advantages while remaining within the spirit and scope of the present disclosure.

Turning now to the figures, FIG. 1 depicts a schematic diagram of an example configuration of a PCM device 100, in accordance with embodiments of the present disclosure. The PCM device 100 includes a bridge cell 104 having a first pad 108, a second pad 112, and a strip 116 connecting the first pad 108 and the second pad 112. The PCM device 100 further includes a first electrode 120, which is connected to the first pad 108, and a second electrode 124, which is connected to the second pad 112 of the bridge cell 104.

The bridge cell 104 is made of phase-change material. More specifically, the first pad 108, the second pad 112, and the strip 116 are all made of the phase-change material. In accordance with at least some embodiments of the present disclosure, the phase-change material can be, for example, either elemental or binary or ternary alloys of antimony, tellurium, and germanium. In accordance with at least some embodiments of the present disclosure, the phase-change material can be doped with, for example, nitrogen, silicon, carbon, oxygen, or a combination of these elements. The phase-change material is selected for its temperature-dependent crystallization properties such that the phase-change material of the bridge cell 104 is changeable between an amorphous state and a crystallized state by application of electrical current at levels suitable for implementation in integrated circuits.

In FIG. 1, the strip 116 is shown as containing a relatively large amorphous region 128, wherein the phase-change material in the amorphous state, compared to a crystalline region 132, wherein the phase-change material is in the crystalline state. Each of the amorphous region 128 and the crystalline region 132 may be contiguous or non-contiguous. In non-contiguous instances, the region is considered to be the accumulation of the non-contiguous parts. It is to be understood that the relative sizes, including volumes, of the amorphous region 128 and crystalline region 132 are changeable and that the particular arrangement shown in FIG. 1 is for illustrative purposes. However, it is also to be noted that the relatively large size of the amorphous region 128 is an advantage, enabling operability in higher resistance-ranges, that is facilitated by the PCM device 100 disclosed herein.

The first electrode 120 and the second electrode 124 can be made of, for example, tungsten or titanium nitride. The use of such materials for electrodes is generally known in the art. For illustrative purposes, the first electrode 120 will be considered the positive electrode and the second electrode 124 will be considered the negative electrode. Accordingly, the first electrode 120 may also be referred to herein as the positive electrode 120 and the second electrode 124 may also be referred to herein as the negative electrode 124.

As shown in FIG. 1, in accordance with at least some embodiments of the present disclosure, the PCM device 100 further includes a first coating 136 on the first electrode 120 and a second coating 140 on the second electrode 124. The first coating 136 is at least partially made of a high workfunction material such as, for example, ruthenium, cobalt, nickel, rhenium, iridium, palladium, platinum, or a combination of these materials. In contrast, the second coating 140 is at least partially made of a low workfunction material such as, for example, tantalum, hafnium, zirconium, erbium, ytterbium, dysprosium, holmium, or a combination of these materials.

Accordingly, the high workfunction material of the first coating 136 increases the workfunction of the first electrode 120 relative to the workfunction of the second electrode 124. Additionally, by decreasing the workfunction of the second electrode 124 relative to the first electrode 120, the low workfunction material of the second coating 140 further increases the workfunction of the first electrode 120 relative to the workfunction of the second electrode 124.

Figure 2:
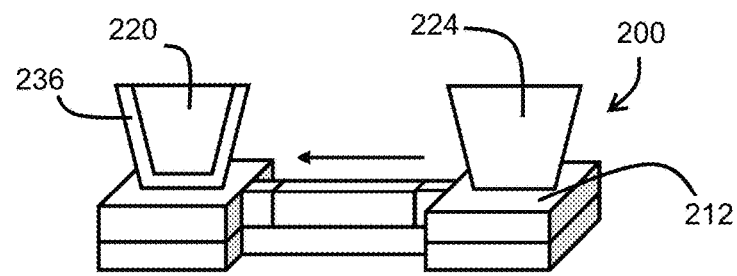
FIG. 2 is a schematic diagram depicting another example configuration of a PCM device, in accordance with embodiments of the present disclosure.

While the embodiment shown in FIG. 1 includes both the first coating 136 and the second coating 140, in at least some embodiments of the present disclosure, for example as shown in FIG. 2, it is possible for the PCM device 200 to include only the first coating 236 on the first electrode 220. Alternatively, in at least some embodiments of the present disclosure (not shown), it is possible for the PCM device to include only the second coating. Any of these embodiments will have the effect of increasing the workfunction of the first electrode 120 relative to the workfunction of the second electrode 124.

As shown in FIG. 1, the first coating 136 is in direct contact with the phase-change material of the first pad 108 and the second coating 140 is in direct contact with the phase-change material of the second pad 112. For embodiments wherein the PCM device 100 includes only one of the first and second coatings 136, 140, the uncoated electrode is in direct contact with the phase-change material of the respective pad. For example, as shown in FIG. 2, the second electrode 224, which is uncoated, is in direct contact with the phase-change material of the second pad 212.

In accordance with at least some embodiments of the present disclosure, the PCM device 100 further includes a projection liner 144 in contact with the first pad 108, the second pad 112, and the strip 116 of the bridge cell 104. The projection liner 144 can be made of, for example, carbon, TiN, TiC, TaN, TaC, WN, WC, TiSiN, or TaSiN. The projection liner 144 reduces resistance-drift, noise, and temperature sensitivity of the bridge cell 104. In some alternative embodiments of the present disclosure, the PCM device 100 may not include a projection liner 144.

For embodiments, such as that shown in FIG. 1, wherein the PCM device 100 does include the projection liner 144, the projection liner 144 is arranged so as not to interfere with the direct contact between the first and/or second coatings 136, 140 and the phase-change material. Accordingly, in such embodiments, the projection liner 144 is arranged on a side of the bridge cell 104 opposite the first and second electrodes 120, 124.

Figure 3:
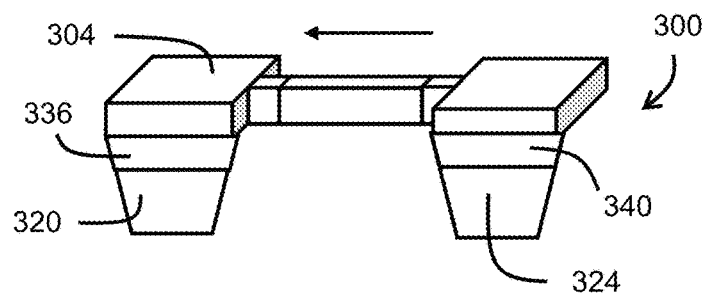
FIG. 3 is a schematic diagram depicting another example configuration of a PCM device, in accordance with embodiments of the present disclosure.

Alternatively, for embodiments of the present disclosure, such as that shown in FIG. 3, wherein the PCM device 300 does not include a projection liner, it is possible to arrange the first and second electrodes 320, 324, and therefore the first and/or second coatings 336, 340 on the opposite side of the bridge cell 304 so long as the direct contact between the first and/or second coatings 336, 340 and the phase change material is maintained. Additionally, as shown in FIG. 3, the first and/or second coatings 336, 340 may not envelop, or wrap around, the first and/or second electrodes 320, 324. Instead, the first and/or second coatings 336, 340 may only contact the first and/or second electrodes 320, 324 along the surface that would otherwise contact the bridge cell 304.

Figure 4:
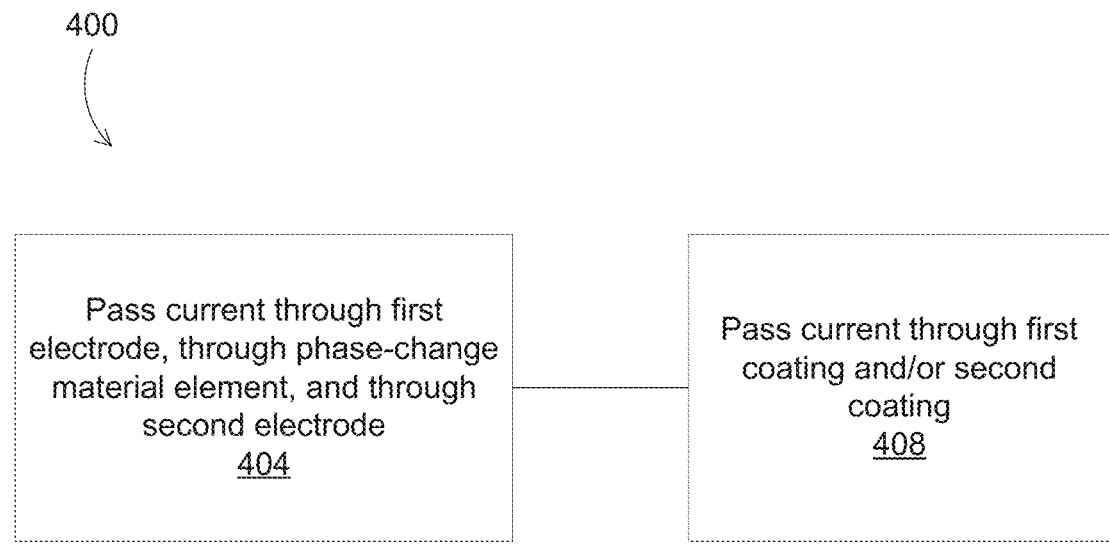
FIG. 4 depicts a flowchart of an example method of operating a PCM device, in accordance with embodiments of the present disclosure.

Turning now to FIG. 4, a flowchart depicts an embodiment of a method 400, according to embodiments of the present disclosure, of operating a memory device such as the PCM devices 100, 200, 300 described above and shown in FIGS. 1-3. Method 400 includes operation 404, wherein a current is passed through a first electrode, through a phase-change material element, and through a second electrode when a voltage of the current is greater than a threshold voltage of the phase-change material.

In the context of the PCM device 100 shown in FIG. 1, the current can be, for example, a programming current. In the present example, performing operation 404 includes passing the programming current through the bridge cell 104 of the PCM device 100 in the direction indicated by the arrow 148. Accordingly, the programming current passes from the negative electrode 124, through the bridge cell 104, and through the positive electrode 120.

Returning to FIG. 4, the method 400 also includes operation 408 wherein the current is passed through at least one of a first coating on the first electrode and a second coating on the second electrode. Each of the first coating and the second coating is configured to increase a difference in workfunction between the first electrode and the second electrode.

In the context of the PCM device 100, performing operation 408 includes passing the current through the first coating 136 and/or the second coating 140. For embodiments wherein the PCM device 100 includes the first coating 136, performing operation 408 includes passing current through the first coating 136. Likewise, for embodiments wherein the PCM device 100 includes the second coating 140, performing operation 408 includes passing current through the second coating 140.

Therefore, in the context of the PCM device 100 shown in FIG. 1, performing method 400 includes passing the programming current from the negative electrode 124, through the second coating 140, through the second pad 112, through the strip 116, through the first pad 108, through the first coating 136, and through the positive electrode 120. In order to program the bridge cell 104, the programming voltage carried by the programming current must exceed the threshold programming voltage of the bridge cell 104. By increasing the difference in workfunction between the first electrode 120 and the second electrode 124, the first and second coatings 136, 140 reduce the threshold programming voltage of the bridge cell 104. Thus, the first and second coatings 136, 140 enable the operability of the PCM device 100 in high resistance ranges by compensating for the maintenance of a large amount of the phase-change material in the amorphous state.

For embodiments of the present disclosure wherein only the first electrode 120 includes the respective coating 136, performing the method 400 includes passing the programming current from the negative electrode 124, through the second pad 112, through the strip 116, through the first pad 108, through the first coating 136, and through the positive electrode 120. Analogously, for embodiments of the present disclosure wherein only the second electrode 124 includes the respective coating 140, performing the method 400 includes passing the programming current from the negative electrode 124, through the second coating 140, through the second pad 112, through the strip 116, through the first pad 108, and through the positive electrode 120. In any of these embodiments, the at least one of the first and second coating 136, 140 enables the operability of the PCM device 100 in high resistance ranges by compensating for the maintenance of a large amount of the phase-change material in the amorphous state.

Figure 5:
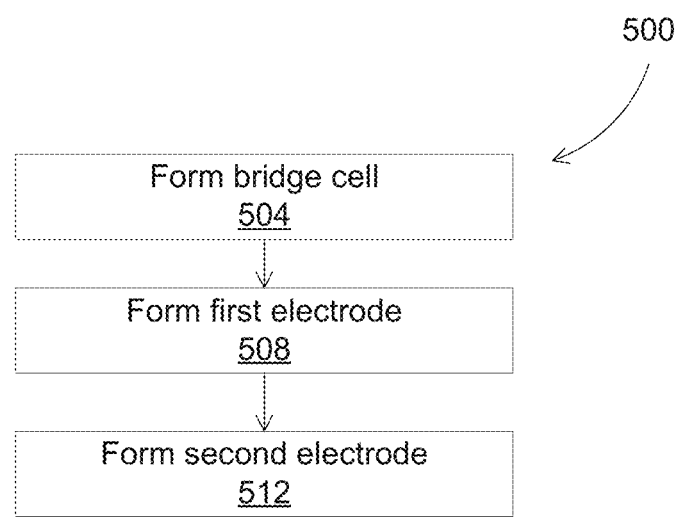
FIG. 5 depicts a flowchart of an example method of forming a PCM device, in accordance with embodiments of the present disclosure.

Turning now to FIG. 5, a flowchart depicts a method 500 of forming a memory device such as, for example, the PCM device 100 shown in FIG. 1, in accordance with embodiments of the present disclosure. The method 500 begins at operation 504, which includes forming a bridge cell. Forming the bridge cell includes forming the bridge cell out of a phase-change material. In accordance with at least some embodiments of the present disclosure, forming the bridge cell can include forming the bridge cell out of a projection liner in addition to the phase-change material. In accordance with at least some embodiments of the present disclosure, operation 504 includes patterning the phase-change material. In accordance with at least some embodiments of the present disclosure, patterning the phase-change material includes specifically selecting the dimensions for patterning the strip of the bridge cell because the dimensions of the strip of the bridge cell may vary depending on the phase-change material that is used. For embodiments including a projection liner, operation 504 also includes patterning the projection liner. In accordance with at least some embodiments of the present disclosure, operation 504 further includes depositing SiN encapsulation films. In accordance with at least some embodiments of the present disclosure, operation 504 further includes deposition of an interlayer dielectric (ILD) material for contact patterning followed by CMP.

Figure 6A:
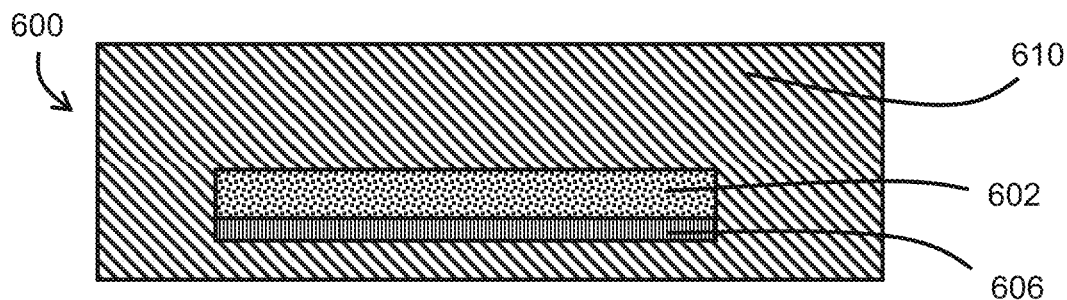
FIG. 6A depicts a schematic side cross-sectional drawing of a PCM device following the performance of a portion of the method shown in FIG. 5, in accordance with embodiments of the present disclosure.

FIG. 6A depicts a side cross-sectional view of the device 600 following the performance of operation 504 of the method 500. Accordingly, FIG. 6A includes phase-change material 602 that forms the bridge cell, projection liner material 606 that forms the projection liner, and encapsulation film material 610 that forms the encapsulation film.

Operation 508 of the method 500 includes forming a first electrode. Forming the first electrode includes patterning the first electrode contact. Forming the first electrode further includes CVD or PVD of the electrode material (for example, tungsten or titanium nitride). For embodiments wherein the device includes a first coating on the first electrode, operation 508 further includes CVD/ALD or PVD of the high workfunction metal (for example, ruthenium) prior to the CVD or PVD deposition of the electrode material.

Figure 6B:
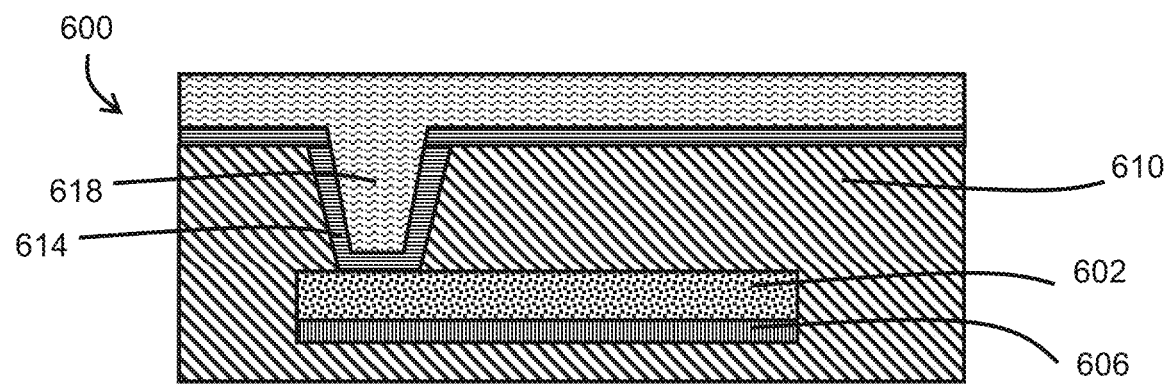
FIG. 6B depicts a schematic side cross-sectional drawing of a PCM device following the performance of a portion of the method shown in FIG. 5, in accordance with embodiments of the present disclosure.

FIG. 6B depicts a side cross-sectional view of the device 600 following the performance of operation 508 of the method 500. The illustrative example shown in FIG. 6B is that of an embodiment of the device 600 which does include a first coating on the first electrode. Thus, FIG. 6B includes first coating material 614 that forms the first coating and first electrode material 618 that forms the first electrode.

Figure 6C:
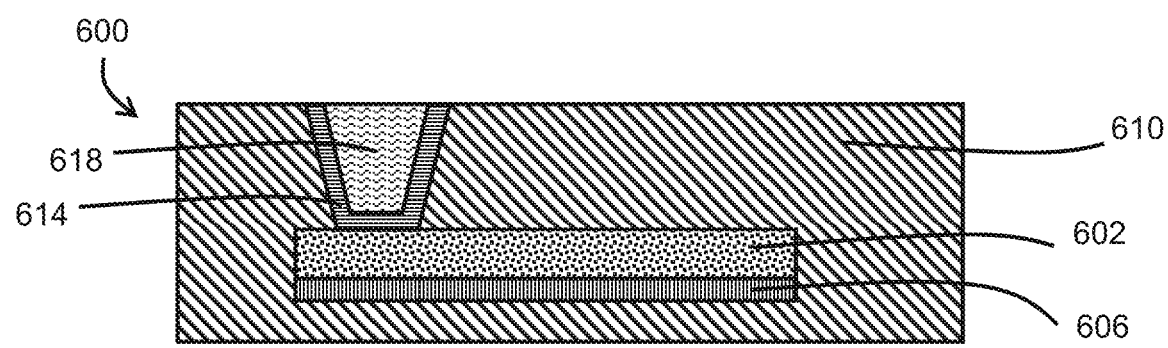
FIG. 6C depicts a schematic side cross-sectional drawing of a PCM device following the performance of a portion of the method shown in FIG. 5, in accordance with embodiments of the present disclosure.

In accordance with at least some embodiments of the present disclosure, operation 508 further includes CMP of the first electrode with the high workfunction metal in contact with the phase-change material. FIG. 6C depicts a side cross-sectional view of the device following the performance of operation 508 in such embodiments.

Operation 512 of the method 500 includes forming a second electrode. Forming the second electrode includes patterning the second electrode contact. Forming the second electrode includes CVD or PVD of the electrode material (for example, tungsten or titanium nitride). For embodiments wherein the device includes a second coating on the second electrode, operation 512 further includes CVD/ALD or PVD of the low workfunction metal (for example, tantalum or hafnium) prior to the CVD or PVD deposition of the electrode material.

Figure 6D:
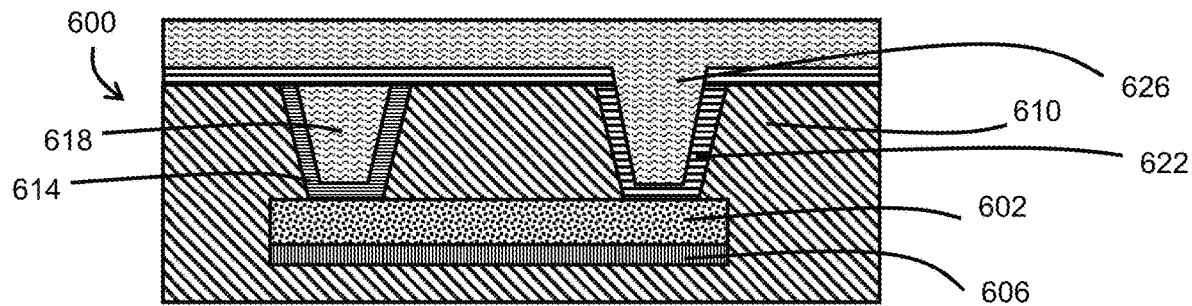
FIG. 6D depicts a schematic side cross-sectional drawing of a PCM device following the performance of a portion of the method shown in FIG. 5, in accordance with embodiments of the present disclosure.

FIG. 6D depicts a side cross-sectional view of the device following the performance of operation 512 of the method 500. The illustrative example shown in FIG. 6D is that of an embodiment of the device 600 which does include a second coating on the second electrode. Thus, FIG. 6D includes second coating material 622 that forms the second coating and second electrode material 626 that forms the second electrode. In the present embodiment, the first electrode material 618 and the second electrode material 626 are the same material. In alternative embodiments, however, the first electrode material 618 can be different than the second electrode material 626.

Figure 6E:
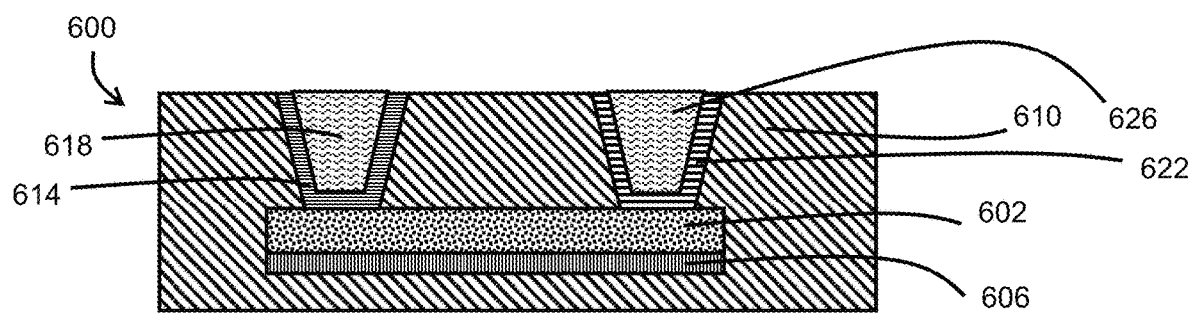
FIG. 6E depicts a schematic side cross-sectional drawing of a PCM device following the performance of a portion of the method shown in FIG. 5, in accordance with embodiments of the present disclosure.

In accordance with at least some embodiments of the present disclosure, operation 512 further includes CMP of the second electrode with the low workfunction metal in contact with the phase-change material. FIG. 6E depicts a side cross-sectional view of the device following the performance of operation 512 in such embodiments.

Figure 6F:
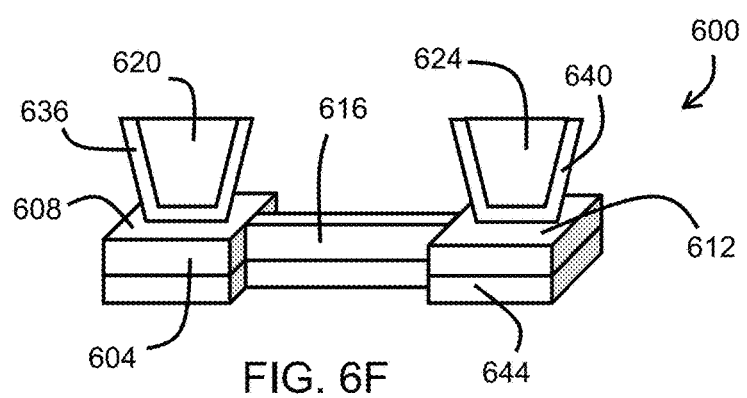
FIG. 6F depicts a schematic perspective drawing of a PCM device following the performance of a portion of the method shown in FIG. 5, in accordance with embodiments of the present disclosure.

FIG. 6F depicts a schematic drawing of a perspective view of a memory device 600 formed according to the method 500. Thus, the memory device 600 includes the bridge cell 604, including the first pad 608, the second pad 612, and the strip 616, formed of the phase-change material 602. The memory device 600 further includes the projection liner 644 formed of the projection liner material 606, the first electrode 620 formed of the first electrode material 618, the second electrode 624 formed of the second electrode material 626, the first coating 636 formed of the first coating material 614, the second coating 640 formed of the second coating material 622.

Figure 7:
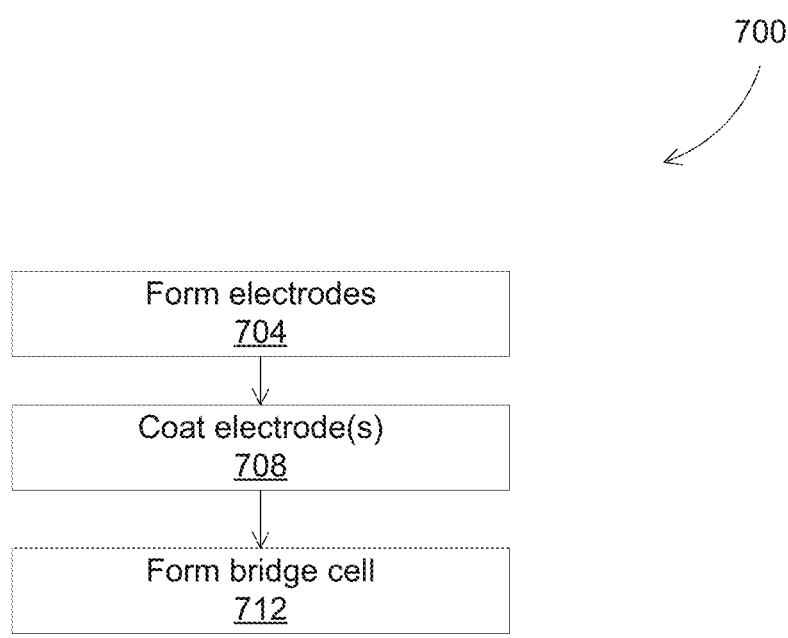
FIG. 7 depicts a flowchart of an example method of forming a PCM device, in accordance with embodiments of the present disclosure.

FIG. 7 depicts a flowchart of another method 700 of forming a memory device such as, for example, the PCM device 300 shown in FIG. 3. The method 700 begins at operation 704, which includes forming first and second electrodes. In accordance with at least some embodiments of the present disclosure, operation 704 includes patterning followed by CVD metallization and CMP. In accordance with at least one embodiment of the present disclosure, the first and second electrodes are formed of tungsten or titanium nitride and are formed in an encapsulation film of SiN. In the present embodiment, the first and second electrodes are formed of the same material. In alternative embodiments, it is possible for the first electrode to be formed of a material that is different than the second electrode.

Figure 8A:
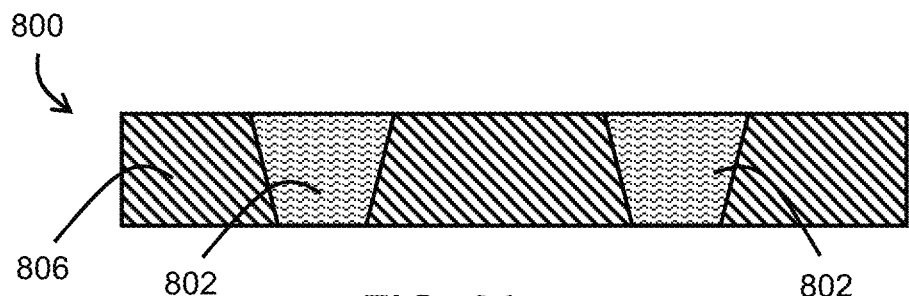
FIG. 8A depicts a schematic side cross-sectional drawing of a PCM device following the performance of a portion of the method shown in FIG. 7, in accordance with embodiments of the present disclosure.

FIG. 8A depicts a side cross-sectional view of the device 800 following the performance of operation 704 of the method 700. Accordingly, FIG. 8A includes the electrode material 802 that forms the first and second electrodes and an encapsulation film material 806 that forms the encapsulation film.

Operation 708 of the method 700 includes metallizing at least one electrode with a workfunction altering metal. According to an illustrative example, operation 708 includes metallizing the first electrode with the high workfunction metal, for example ruthenium. As used herein, metallizing an electrode refers to a process of coating the electrode with a coating of the workfunction altering metal.

In accordance with at least some embodiments of the present disclosure, operation 708 includes block masking to selectively open the at least one electrode. According to the illustrative example, such embodiments of operation 708 include block masking to selectively open the first electrode.

Figure 8B:
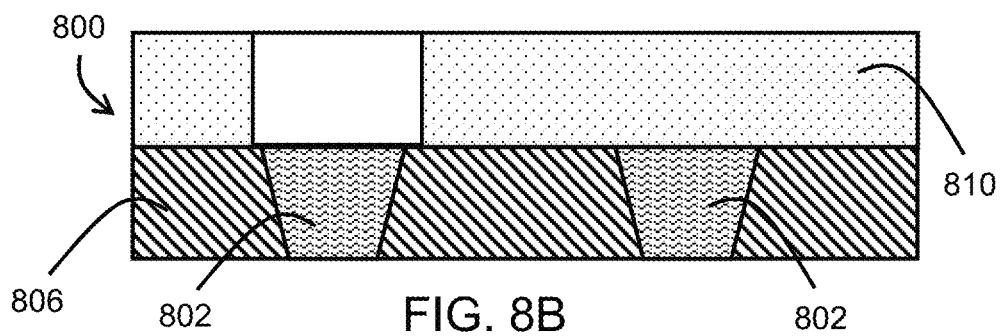
FIG. 8B depicts a schematic side cross-sectional drawing of a PCM device following the performance of a portion of the method shown in FIG. 7, in accordance with embodiments of the present disclosure.

FIG. 8B depicts a side cross-sectional view of the device following the performance of block masking in such embodiments. Accordingly, FIG. 8B includes a masking material 810 that forms the block masking.

Figure 8C:
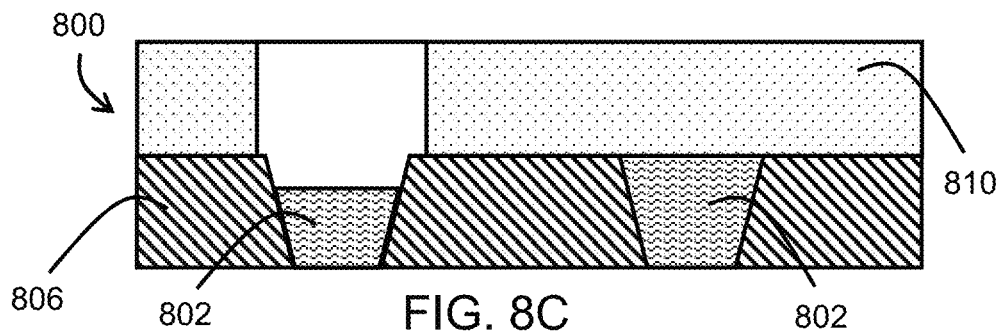
FIG. 8C depicts a schematic side cross-sectional drawing of a PCM device following the performance of a portion of the method shown in FIG. 7, in accordance with embodiments of the present disclosure.

In accordance with at least some embodiments of the present disclosure, operation 708 includes recessing the electrode material selective to ILD using halide based RIE. According to the illustrative example, such embodiments of operation 708 include recessing the first electrode material. FIG. 8C depicts a side cross-sectional view of the device following the performance of recessing the first electrode material in such embodiments.

Operation 708 of the method 700 further includes CVD of the workfunction altering metal. In alternative embodiments, the workfunction altering metal can be formed in another manner compatible with the other operations of the method 700. According to the illustrative example, such embodiments of operation 708 include CVD of the high workfunction metal.

Figure 8D:
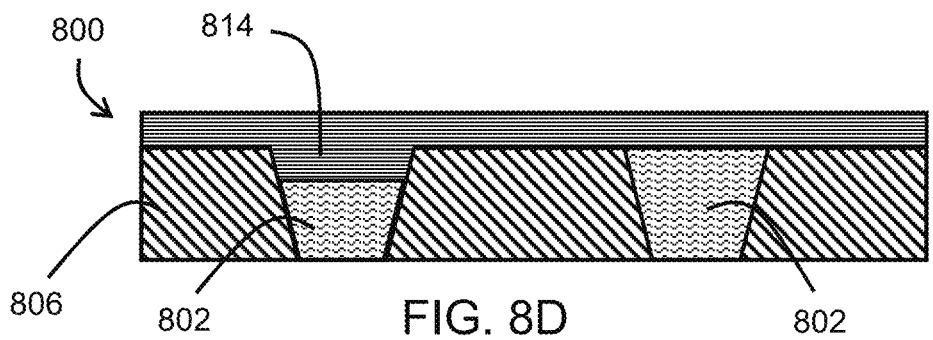
FIG. 8D depicts a schematic side cross-sectional drawing of a PCM device following the performance of a portion of the method shown in FIG. 7, in accordance with embodiments of the present disclosure.

FIG. 8D depicts a side cross-sectional view of the device following the performance of operation 708. For embodiments wherein operation 708 includes block masking, operation 708 further includes removing the block mask after recessing the electrode material and prior to CVD of the workfunction altering metal. Thus, FIG. 8D includes a first coating material 814 that forms the first coating of the first electrode of the device 800.

Operation 712 of the method 700 includes forming a bridge cell. Forming the bridge cell includes forming a layer of a phase-change material. In accordance with at least some embodiments of the present disclosure, performing operation 712 can include CMP. In accordance with at least some embodiments of the present disclosure, performing operation 712 can include deposition of the phase-change material. Forming the bridge cell includes forming the layer of phase-change material in direct contact with the workfunction altering material(s). Accordingly, for embodiments wherein the bridge cell includes a projection liner, performing operation 712 can include deposition of the projection liner following the deposition of the phase-change material such that the projection liner does not interfere with the direct contact between the phase-change material and the workfunction altering material.

Figure 8E:
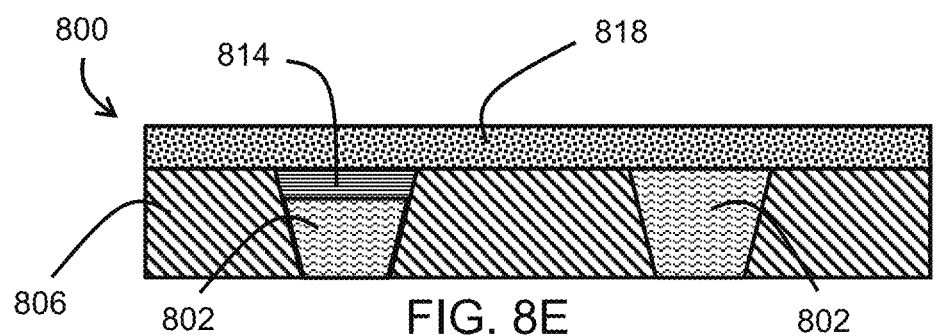
FIG. 8E depicts a schematic side cross-sectional drawing of a PCM device following the performance of a portion of the method shown in FIG. 7, in accordance with embodiments of the present disclosure.

FIG. 8E depicts a side cross-sectional view of the device following the performance of forming the layer of phase-change material. Thus, FIG. 8E includes phase change material 818 that forms the bridge cell of the device 800.

Figure 8F:
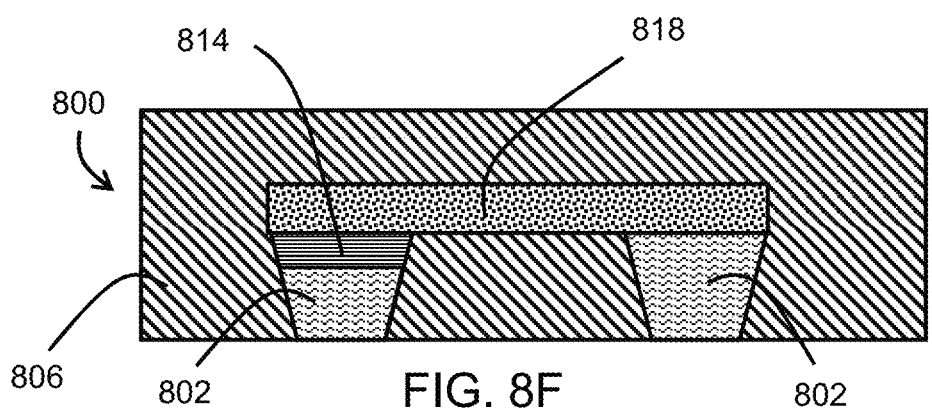
FIG. 8F depicts a schematic side cross-sectional drawing of a PCM device following the performance of a portion of the method shown in FIG. 7, in accordance with embodiments of the present disclosure.

Forming the bridge cell further includes patterning the bridge cell of the layer of phase-change material, followed by encapsulation. For embodiments wherein the bridge cell includes the projection liner, patterning the bridge cell also includes patterning the projection liner, and encapsulation includes encapsulation of the projection liner. FIG. 8F depicts a side cross-sectional view of the device following the performance of operation 712.

Figure 8G:
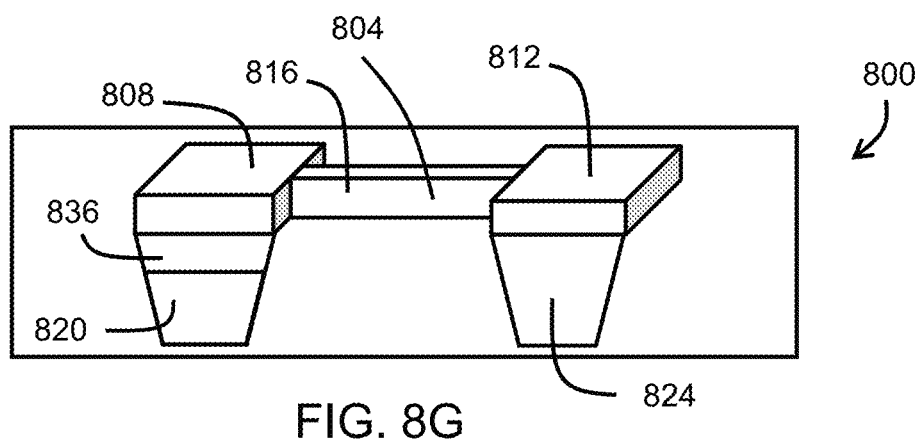
FIG. 8G depicts a schematic side cross-sectional drawing of a PCM device following the performance of a portion of the method shown in FIG. 7, in accordance with embodiments of the present disclosure.

FIG. 8G depicts a schematic drawing of a perspective view of a memory device 800 formed according to the method 700. Thus, the memory device 800 includes the bridge cell 804, including the first pad 808, the second pad 812, and the strip 816, formed of the phase change material 818. The memory device 800 further includes the first electrode 820 and the second electrode 824 formed of the electrode material 802, and the first coating 836 formed of the first coating material 814.

While the illustrative example of the method 700 discussed herein includes metallizing only the first electrode 820 of the device 800, in accordance with alternative embodiments of the present disclosure, the method 700 could also be used to metallize only the second electrode 824. Furthermore, in accordance with other alternative embodiments of the present disclosure, the method 700 could also be used to metallize both the first and second electrodes 820, 824.

The procedures and operations listed above provide an example of fabrication processes which may be used to form the devices in methods 500 and 700. In alternative embodiments of the present disclosure, the results of the procedures listed above, which are illustrated in FIGS. 6A-6F and 8A-8G, can be achieved by the performance of other known procedures.

As illustrated by methods 500 and 700, forming a PCM device can include forming the bridge cell prior to forming the electrodes (as is the case in method 500) or forming the electrodes prior to forming the bridge cell (as is the case in method 700). Accordingly, it is to be understood that various methods can be used to form a PCM device according to the present disclosure. Any such methods will result in a memory cell made of a phase-change material that is in direct contact with at least one workfunction altering coating of an electrode.

Figure 9:
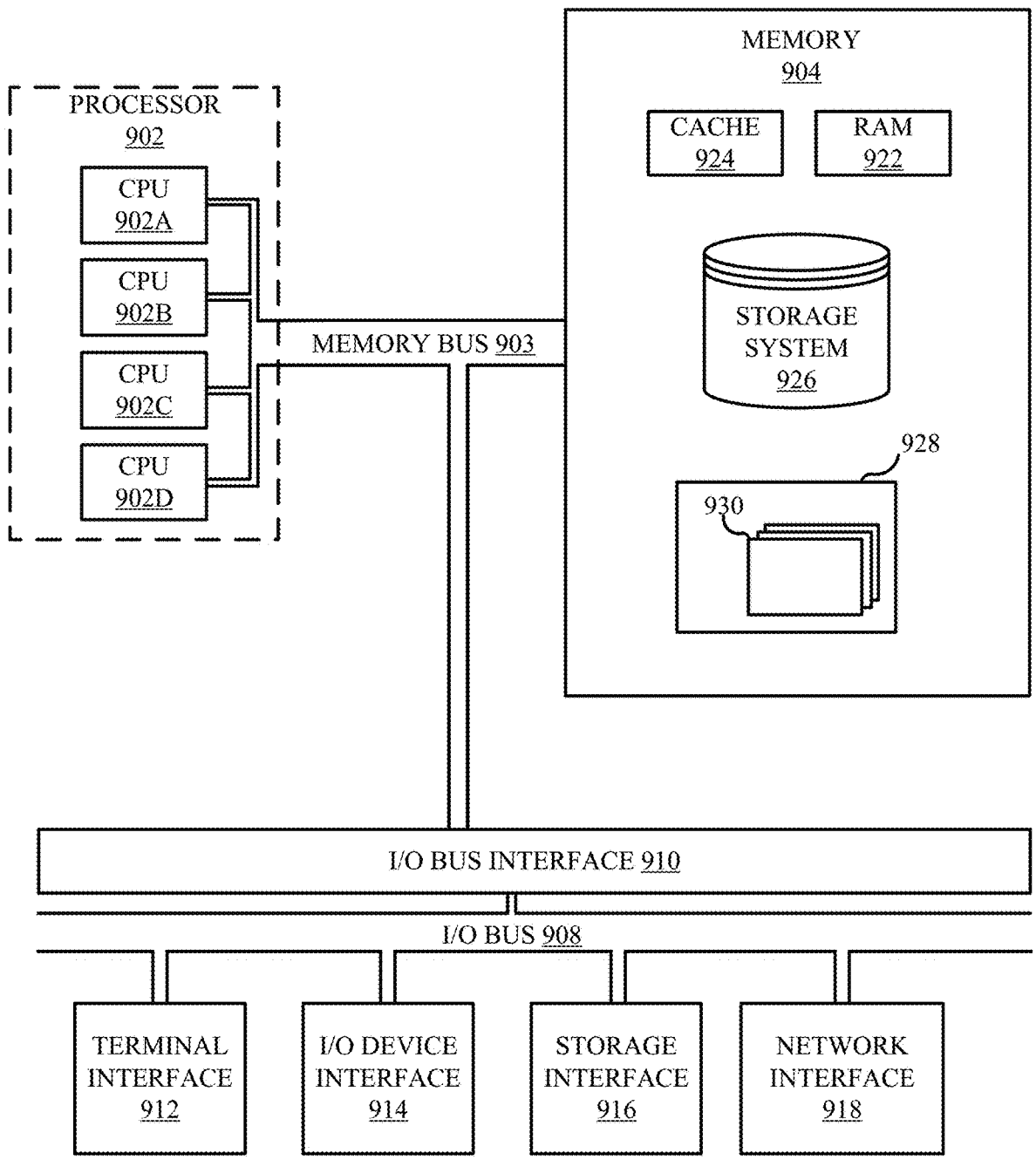
FIG. 9 illustrates a high-level block diagram of an example computer system that may be used in implementing one or more of the methods, tools, and modules, and any related functions, described herein, in accordance with embodiments of the present disclosure.

Referring now to FIG. 9, shown is a high-level block diagram of an example computer system 901 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 901 may comprise one or more CPUs 902, a memory subsystem 904, a terminal interface 912, a storage interface 916, an I/O (Input/Output) device interface 914, and a network interface 918, all of which may be communicatively coupled, directly or indirectly, for inter-component communication via a memory bus 903, an I/O bus 908, and an I/O bus interface unit 910.

The computer system 901 may contain one or more general-purpose programmable central processing units (CPUs) 902A, 902B, 902C, and 902D, herein generically referred to as the CPU 902. In some embodiments, the computer system 901 may contain multiple processors typical of a relatively large system; however, in other embodiments the computer system 901 may alternatively be a single CPU system. Each CPU 902 may execute instructions stored in the memory subsystem 904 and may include one or more levels of on-board cache.

System memory 904 may include computer system readable media in the form of volatile memory, such as random access memory (RAM) 922 or cache memory 924. Computer system 901 may further include other removable/non-removable, volatile/non-volatile computer system storage media. By way of example only, storage system 926 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 904 can include flash memory, e.g., a flash memory stick drive or a flash drive. Memory devices can be connected to memory bus 903 by one or more data media interfaces. The memory 904 may include at least one program product having a set (e.g., at least one) of program modules that are configured to carry out the functions of various embodiments.

One or more programs/utilities 928, each having at least one set of program modules 930 may be stored in memory 904. The programs/utilities 928 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 930 generally perform the functions or methodologies of various embodiments.

Although the memory bus 903 is shown in FIG. 9 as a single bus structure providing a direct communication path among the CPUs 902, the memory subsystem 904, and the I/O bus interface 910, the memory bus 903 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 910 and the I/O bus 908 are shown as single respective units, the computer system 901 may, in some embodiments, contain multiple I/O bus interface units 910, multiple I/O buses 908, or both. Further, while multiple I/O interface units are shown, which separate the I/O bus 908 from various communications paths running to the various I/O devices, in other embodiments some or all of the I/O devices may be connected directly to one or more system I/O buses.

In some embodiments, the computer system 901 may be a multi-user mainframe computer system, a single-user system, or a server computer or similar device that has little or no direct user interface, but receives requests from other computer systems (clients). Further, in some embodiments, the computer system 901 may be implemented as a desktop computer, portable computer, laptop or notebook computer, tablet computer, pocket computer, telephone, smart phone, network switches or routers, or any other appropriate type of electronic device.

It is noted that FIG. 9 is intended to depict the representative major components of an exemplary computer system 901. In some embodiments, however, individual components may have greater or lesser complexity than as represented in FIG. 9, components other than or in addition to those shown in FIG. 9 may be present, and the number, type, and configuration of such components may vary. Furthermore, the modules are listed and described illustratively according to an embodiment and are not meant to indicate necessity of a particular module or exclusivity of other potential modules (or functions/purposes as applied to a specific module).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one" of means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. A device comprising:
an electronic component including a first pad, a second pad, and a strip connecting the first pad and the second pad;
a first electrode in contact with the first pad; and
a second electrode in contact with the second pad, wherein:
the entire electronic component is made of a phase change material; and
at least one of the first electrode and the second electrode is coated with a material that is configured to increase a difference in workfunction between the first electrode and the second electrode.

2. The device of claim 1, wherein:
the electronic component is a memory element configured to store a resistive state.

3. The device of claim 1, wherein:
the strip includes an amorphous region in which the phase change material is in an amorphous state.

4. The device of claim 3, wherein:
the strip includes at least one crystalline region in which the phase change material is in a crystalline state; and
the amorphous region is more voluminous than the at least one crystalline region.

5. The device of claim 1, wherein the first electrode is downstream of the second electrode in a direction in which programming current flows.

6. The device of claim 1, wherein:
the first electrode is coated with a high workfunction material which increases the workfunction of the first electrode relative to the second electrode; and
the first electrode is in contact with the first pad via the high workfunction material.

7. The device of claim 1, wherein:
the second electrode is coated with a low workfunction material which decreases the workfunction of the second electrode relative to the first electrode; and
the second electrode is in contact with the second pad via the low workfunction material.

8. The device of claim 7, wherein:
the first electrode is coated with a high workfunction material which increases the workfunction of the first electrode relative to the second electrode; and
the first electrode is in contact with the first pad via the high workfunction material.

9. The device of claim 1, further comprising:
a projection layer in contact with the electronic component, wherein the projection layer is arranged on a side of the electronic component opposite a side on which the first electrode and the second electrode are in contact with the electronic component.

10. A method of operating a memory device, the method comprising:
passing a current from a first electrode, through a phase-change material element, and through a second electrode when a voltage of the current is greater than a threshold voltage of the phase-change material; and
passing the current through (i) a first coating on the first electrode and (ii) a second coating on the second electrode, wherein each of the first coating and the second coating is configured to increase a difference in workfunction between the first electrode and the second electrode.

11. The method of claim 10, wherein:
passing the current through the phase-change material element includes passing the current through a first pad of the phase-change material element, and
the first pad is in direct contact with the first coating.

12. The method of claim 10, wherein:
passing the current through the phase-change material element includes passing the current through a second pad of the phase-change material element, and
the second pad is in direct contact with the second coating.

13. The method of claim 12, wherein:
passing the current through the phase-change material element includes passing the current through a first pad of the phase-change material element, and
the first pad is in direct contact with the first coating.

14. A method of forming a memory device, the method including:
forming a memory cell made of a phase-change material, wherein the memory cell includes a first pad, a second pad, and a strip connecting the first pad and the second pad, and wherein a strip width of the strip is smaller than a pad width of at least one of the first pad and the second pad;
forming an electrode having a coating, wherein:
the coating alters the workfunction of the electrode, and
the coating is in direct contact with the phase-change material.

15. The method of claim 14, wherein:
forming the electrode occurs prior to forming the memory cell.

16. The method of claim 14, wherein:
forming the memory cell occurs prior to forming the electrode.

17. The method of claim 14, wherein:
forming the memory cell includes forming the first pad, the second pad, and the strip connecting the first pad and the second pad such that the first pad, the second pad, and the strip are all made of the phase-change material.

18. The method of claim 14, further comprising:
forming a projection liner in direct contact with the memory cell such that the projection liner does not interfere with the direct contact between the coating and the phase-change material.

19. The method of claim 14, wherein:
forming the memory cell includes forming the strip such that a strip thickness of the strip is smaller than a pad thickness of at least one of the first pad and the second pad.

20. The method of claim 1, wherein:
the first electrode is in contact with a first side of the electronic component; and
the second electrode is in contact with the first side of the electronic component.

\* \* \* \* \*